United States Patent
Satani et al.

(10) Patent No.: US 7,031,208 B2
(45) Date of Patent: Apr. 18, 2006

(54) SEMICONDUCTOR MEMORY DEVICE

(75) Inventors: Norihiko Satani, Miyazaki (JP);
Shinichiro Sato, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 271 days.

(21) Appl. No.: 10/648,372

(22) Filed: Aug. 27, 2003

(65) Prior Publication Data

US 2004/0042301 A1    Mar. 4, 2004

(30) Foreign Application Priority Data

Aug. 27, 2002 (JP) ............................. 2002-246711

(51) Int. Cl.
*G11C 29/00* (2006.01)
*G11C 7/00* (2006.01)

(52) U.S. Cl. .................. 365/200; 365/201; 365/189.05

(58) Field of Classification Search ................ 365/200, 365/201, 189.05
See application file for complete search history.

(56) References Cited

U.S. PATENT DOCUMENTS

| | | | |
|---|---|---|---|
| 5,999,450 A * | 12/1999 | Dallabora et al. | 365/200 |
| 6,079,037 A * | 6/2000 | Beffa et al. | 365/200 |
| 6,094,387 A * | 7/2000 | Mine et al. | 365/200 |
| 6,185,709 B1 * | 2/2001 | Dreibelbis et al. | 365/201 |
| 6,297,997 B1 * | 10/2001 | Ohtani et al. | 365/201 |
| 6,532,182 B1 * | 3/2003 | Ogawa et al. | 365/201 |
| 6,829,183 B1 * | 12/2004 | Braceras | 365/200 |

* cited by examiner

*Primary Examiner*—Trong Phan
(74) *Attorney, Agent, or Firm*—Rabin & Berdo, P.C.

(57) ABSTRACT

A semiconductor memory device includes a redundant memory cell, an electrode and an output circuit. The redundant memory cell is used instead of a memory cell when the memory cell has a defect. The electrode applys with a test signal for setting a test condition from outside in testing the redundant memory cell. The output circuit outputs data read out of the memory cell and the redundant memory cell. When the test signal is applied to the electrode to set the test condition for the redundant memory cell, the output circuit is configured to output data read out of the redundant memory cell at a level different from a signal level of data readout of the memory cell for output.

20 Claims, 4 Drawing Sheets

SEMICONDUCTOR MEMORY DEVICE

BACKGROUND OF THE INVENTION

The present invention relates to a semiconductor memory device having redundant memory cells, particularly to the function of testing the redundant memory cells.

A semiconductor memory device is manufactured by collectively fabricating a plurality of storage circuits in a succession of wafer processes. The fabricated separate storage circuits are to be selected by address signals. Therefore, when the selectable storage circuits have even a single defect, the semiconductor memory device is an unusable defective item. Particularly, as the individual memory devices are reduced in size and increased in the integration degree to grow storage capacity, it is hard to manufacture flawless semiconductor memory devices.

On this account, paying attention that the semiconductor memory device is configured by arranging a plurality of storage circuits having the same patterns, a method is adopted that a substitute storage circuit is prepared beforehand and a storage circuit with a defect is replaced by the substitute storage circuit when the storage circuit originally used has the defect.

However, the traditional DRAM has the following problem. When redundant cells are tested, a probe is brought into contact with individual pads to apply high-level signals. However, it could not be confirmed from outside whether to correctly set the conditions for testing the redundant memory cells inside the device. Therefore, even though the redundant memory cells are not tested appropriately because of logic errors in a test circuit, defects in the circuit patterns formed or contact failure of the probe, such a test result sometimes shows that the redundant memory cell is normal.

SUMMARY OF THE INVENTION

The invention may provide a semiconductor memory device having a test circuit capable of solving the problem of the related art and checking whether to correctly set test conditions inside the device in testing redundant memory cells.

The invention provides a semiconductor memory device having:

a redundant memory cell for use instead of a memory cell when the memory cell has a defect;

an electrode applied with a test signal for setting a test condition from outside in testing the redundant memory cell; and an output circuit for outputting data read out of the memory cell and the redundant memory cell, wherein when the test signal is applied to the electrode to set the test condition for the redundant memory cell, the output circuit is configured to output data read out of the redundant memory cell at a level different from a signal level of data readout of the memory cell for output.

BRIEF DESCRIPTION OF THE DRAWINGS

The teachings of the invention can be readily understood by considering the following detailed description in conjunction with the accompanying drawings, in which.

DESCRIPTION OF THE PREFERRED EMBODIMENT

First Embodiment

Figure 1:
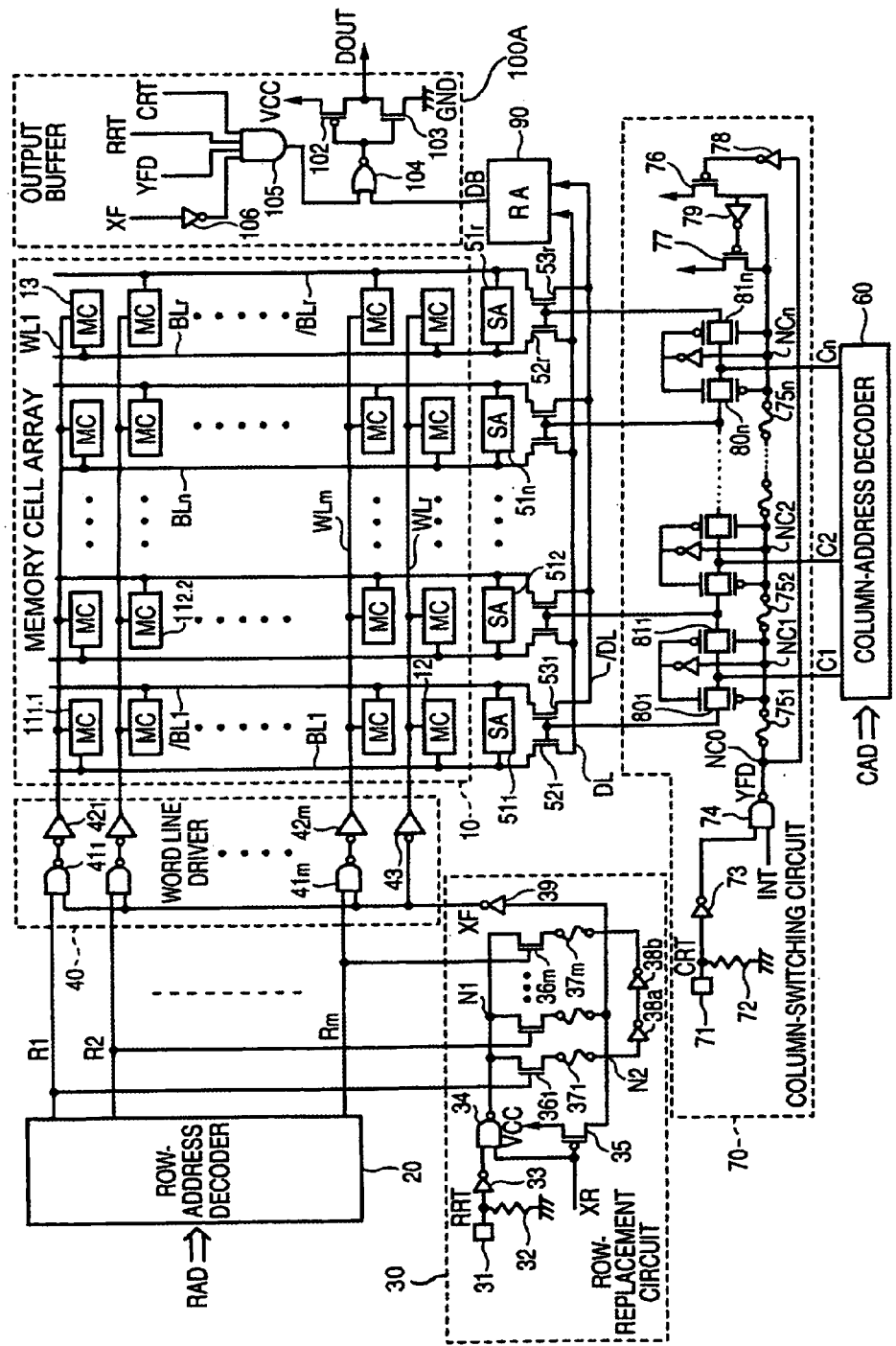
FIG. 1 is a block diagram of a DRAM illustrating a first embodiment of the invention.

FIG. 1 is a block diagram of a DRAM illustrating a first embodiment of the invention. This DRAM has a memory cell array 10 with redundant memory cells. The memory cell array 10 has m lines of word lines Wli (where i=1 to m) arranged in parallel with each other, and a single redundant word line WLr. In addition, the DRAM has n pairs of bit lines BLj, /BLj (where j=1 to n) arranged in parallel with each other and crossing the word lines Wli and WLr, and has a single pair of redundant bit lines BLr, /BLr.

At the cross-points of the word lines Wli and the bit line pairs BLj, /BLj, original memory cells $11_{i,\,j}$ are disposed. Furthermore, at the cross-points of the redundant word line WLr, the bit line pairs BLj, /BLj and the redundant bit line pair BLr, /BLr, redundant memory cells $12_{r,\,k}$ (where k=1 to n, r) are disposed. Moreover, at the cross-points of the redundant bit line pair BLr, /BLr, the word lines WLi and the redundant word line WLr, redundant memory cells $13_{l,\,r}$ (where l=1 to m, r) are disposed.

Each of the memory cells $11_{i,\,j}$ is configured of one capacitor and one insulated gate transistor, not shown in the drawing. Then, the word line WLi controls the transistor to turn on/off, and the bit lines BLj, /BLj write or read data in/out of the capacitor. Each of the redundant memory cells $12_{r,\,k}$ and $13_{l,\,r}$ is the same.

The DRAM has a row-address decoder 20 for selecting the word lines WLi. When row-address signal RAD is applied, the row-address decoder 20 decodes it, turns any one of row-selection signals R1, R2 to Rm to be high level, and outputs it. To the output of the row-address decoder 20, a row-replacement circuit 30 and a word line driver 40 are connected.

The row-replacement circuit 30 is a circuit that when a certain word line WLi or a memory cell 11 connected to this word line WLi has a defect, the word line WLi is inhibited to use and the redundant word line WLr is substituted for the replacement.

The row-replacement circuit 30 has a test pad 31 to which a test signal RRT is applied. The pad 31 is pulled down to the ground voltage GND through a resistor 32 and is connected to an inverter 33. The output of the inverter 33 is connected to one input of a two-input NAND 34. To the other input of the NAND 34, control signal XR is applied which is activated and turned to be high level at the same time when the row-address signal RAD is activated. The output of the NAND 34 is connected to a node N1.

The control signal XR is further applied to the gate of a PMOS 35. The source and drain of the PMOS 35 are connected to the power supply voltage VCC and a node N2, respectively.

Between the nodes N1 and N2, m pairs of an NMOS $36_i$ and a fuse $37_i$ serially connected are arranged in parallel, and the row-selection signal Ri is applied to the gate of each of the NMOSs $36_i$. In addition, a retaining circuit formed of two inverters 38a and 38b serially connected is connected to the node N2. Furthermore, an inverter 39 is connected to the node N2, and control signal XF is outputted from the output of the inverter 39.

The word line driver 40 has two-input NANDS $41_i$ corresponding to the row-selection signals Ri the row-selection signals Ri are applied to one inputs of the NANDs $41_i$ and the control signal XF is commonly applied to the other inputs thereof. The outputs of the NANDs $41_i$ are connected to the word lines WLi through inverting amplifiers $42_i$. Moreover, the word line driver 40 has an inverting amplifier 43 to which the control signal XF is inputted. The redundant word line WLr is connected to the output of the inverting amplifier 43.

The bit line pairs BLj, /BLj are connected to sense amplifiers $51_j$, and connected to data lines DL, /DL through switching NMOSs $52_j$, $53_j$. In addition, the redundant bit line pair BLr, /BLr is connected to a sense amplifier $51_r$, and connected to the data lines DL, /DL through switching NMOSs $52_r$, $53_r$. The NMOSs $52_j$, $53_j$, and $52_r$, $53_r$ are controlled by a column-address decoder 60 and a column switching circuit 70 based on column selection signal CAD.

When the address signal CAD is applied, the column-address decoder 60 decodes it, turns anyone of column selection signals C1, C2 to Cn to be high level, and outputs it. The column switching circuit 70 is connected to the output of the column-address decoder 60.

The column switching circuit 70 has a test pad 71 to which a test signal CRT is applied. The pad 71 is pulled down to the ground voltage GND through a resistor 72 and connected to an inverter 73. The output of the inverter 73 is connected to one input of a two-input NAND 74. To the other input of the NAND 74, initial signal INT is applied that is turned to be low level for a fixed time right after the power is switched on and then turned to be high level. The output of the NAND 74 is connected to a node NC0, and control signal YFD is outputted to the node NC0.

The node NC0 is connected to a node NC1 through a fuse $75_1$, and the node NC1 is connected to a node NC2 through a fuse $75_2$. Subsequently, nodes NC3, NC4 to NCn are similarly connected through fuses $75_2$, $75_3$ to $75_n$. The node NCn is connected to the power supply voltage VCC through a PMOS 76, and also connected to the power supply voltage VCC through a PMOS 77. The control signal YFD is applied to the gate of the PMOS 76 through an inverter 78, and the potential of the node NCn is applied to the gate of the PMOS 77 through an inverter 79. A retaining circuit formed of the PMOSs 76 and 77 and the inverter 79 holds the potential of the node NCn.

The column switching circuit 70 has two TGs $80_j$, $81_j$ controlled to be turned on/off at the level of the node NCj corresponding to each of column selection signals Cj applied from the column-address decoder 60. The TG 80j is in the on state when the node NCj is at low level, and it is in the off state when the node is at high level. On the other hand, the TG $81_j$ is in the off state when the node NCj is at low level, and it is in the on state when the node is at high level.

The output of the TG $80_j$ is connected to the gate of the switching NMOSs $52_j$, $53_j$ corresponding to the bit line pair BLj, /BLj. On the other hand, the output of the TG $81_j$ is connected to the gate of the switching NMOSs $52_{j+1}$, $53_{j+1}$ corresponding to the bit line pair $BL_{j+1}$, $/BL_{j+1}$. In addition, the output of a TG $81_n$ corresponding to the column selection signal Cn is connected to the gate of the switching NMOSs $52_r$, $53_r$ corresponding to the redundant bit line pair BLr, /BLr.

The data lines DL, /DL are connected to a read amplifier 90. The read amplifier 90 amplifies the signals of the bit line pairs BLj, /BLj connected to the data lines DL, /DL to output data signal DB at high level or low level. An output buffer 100A is connected to the output of the read amplifier 90.

The output buffer 100A has a two-input negative OR gate (hereafter, it is called 'NOR') 104, and the data signal DB is applied to a first input of the NOR 104. On the other hand, a four-input AND gate (hereafter, it is called 'AND') 105 is connected to a second input of the NOR 104. The control signal YFD and test signals RRT and CRT are applied to the inputs of the AND 105, and the control signal XF is applied thereto through an inverter 106. A CMOS inverter formed of a PMOS 102 and an NMOS 103 is connected to the output of the NOR 104, and output data DOUT is outputted from the CMOS inverter.

Next, the operation in testing will be described.

Prior to testing the redundant memory cells, probes are brought into contact with the pads 31 and 71 in the DRAM simultaneously, and high-level signals are applied to check a test circuit. At this time, when there are not logic errors in the test circuit, defects in the circuit patterns formed and contact failure of the probe, the test signals RRT and CRT and the control signal YFD are turned to be high level and the control signal XF is turned to be low level. Consequently, the output signal of the AND 105 of the output buffer 100A is turned to be high level, and the output data DOUT is always at high level regardless of the data signal DB outputted from the read amplifier 90.

When there are logic errors in the test circuit, defects in the circuit patterns formed or contact failure of the probe, the output signal of the AND 105 is turned to be low level and the output data DOUT is varied to be high level or low level in accordance with the data signal DB outputted from the read amplifier 90.

In checking the test circuit, the output data DOUT is confirmed to be high level all the time, and then the redundant memory cells are tested. As described above, in testing the redundant memory cells, high-level signals are applied to one of the pads 31 and 71, and thus the output signal of the AND 105 of the output buffer 100A is turned to be low level. Consequently, the output data DOUT is varied to be high level or low level in accordance with the data signal DB outputted from the read amplifier 90, and then the redundant memory cells are tested traditionally.

As described above, the DRAM of the first embodiment has the output buffer 100A for fixing the output data DOUT at high level when the two test signals RRT and CRT are applied simultaneously. Accordingly, the first embodiment has the advantage that can check whether to correctly set the test conditions for the redundant memory cells inside the device.

Second Embodiment

Figure 2:
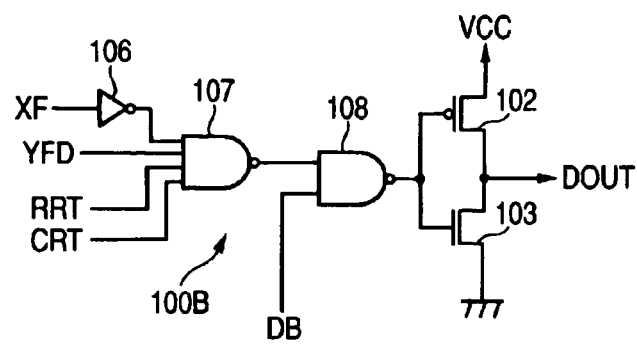
FIG. 2 is a circuit diagram of an output buffer illustrating a second embodiment of the invention.

FIG. 2 is a circuit diagram of an output buffer illustrating a second embodiment of the invention. This output buffer 100B is disposed instead of the output buffer 100A shown in FIG. 1. The same components as those shown in FIG. 1 are designated the same numerals and signs.

The output buffer 100B has a four-input NAND 107 to which the test signals RRT and CRT, the control signal YFD and the control signal XF inverted by an inverter 106 are inputted. The output of the NAND 107 is connected to one input of a two-input NAND 108, and the data signal DB outputted from the read amplifier 90 is applied to the other input of the NAND 108. A CMOS inverter formed of a PMOS 102 and an NMOS 103 is connected to the output of the NAND 108, and the CMOS inverter outputs the output data DOUT.

In the output buffer 100B, only when the test signals RRT and CRT and the control signal YFD are at high level and the control signal XF is at low level, the output signal of the NAND 107 is turned to be low level. The output data DOUT is at low level all the time regardless of the data signal DB. The other operations are the same as those of the first embodiment, and thus the second embodiment has the same advantage.

Third Embodiment

FIG. 3A to 3D are circuit diagrams of output buffers illustrating a third embodiment of the invention. These output buffers 100C to 100F are disposed instead of the output buffer 100A shown in FIG. 1. The same components as those shown in FIG. 1 are designated the same numerals and signs.

Figure 3A:
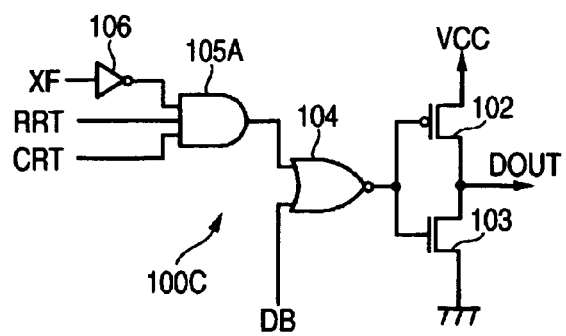
FIGS. 3A to 3D are circuit diagrams of output buffers illustrating a third embodiment of the invention.
Figure 3B:
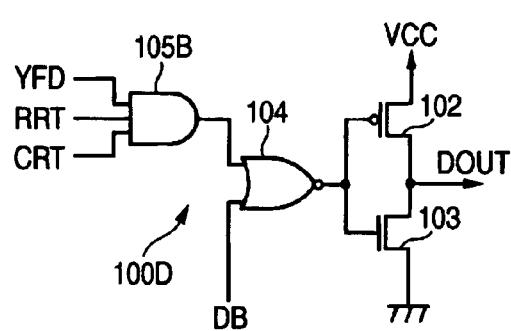

In the output buffer 100C shown in FIG. 3A, the AND 105 in the output buffer 100A shown in FIG. 1 is replaced by a three-input AND 105A to omit inputting the control signal YFD. In addition, in the output buffer 100D shown in FIG. 3B, the AND 105 in the output buffer 100A shown in FIG. 1 is replaced by a three-input AND 105B and the inverter 106 is removed to omit inputting the control signal XF. Both of them cannot confirm the control signals XF and YFD at the same time, but the other operations are almost the same as those of the first embodiment, having the same advantage.

Figure 3C:
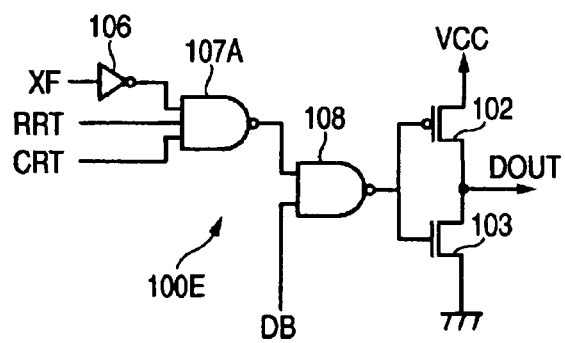
Figure 3D:
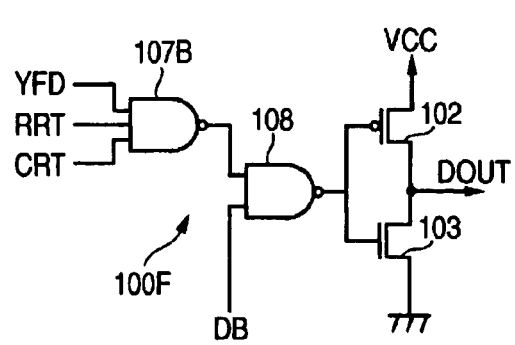

In an output buffer 100E shown in FIG. 3C, the NAND 107 in the output buffer 100B shown in FIG. 2 is replaced by a three-input NAND 107A to omit inputting the control signal YFD. Furthermore, in an output buffer 100F shown in FIG. 3D, the NAND 107 in the output buffer 100B shown in FIG. 2 is replaced by a three-input NAND 107B and the inverter 106 is removed to omit inputting the control signal XF. Both of them cannot confirm the control signals XF and YFD at the same time, but the other operations are almost the same as the second embodiment, having the same advantage.

Fourth Embodiment

Figure 4:
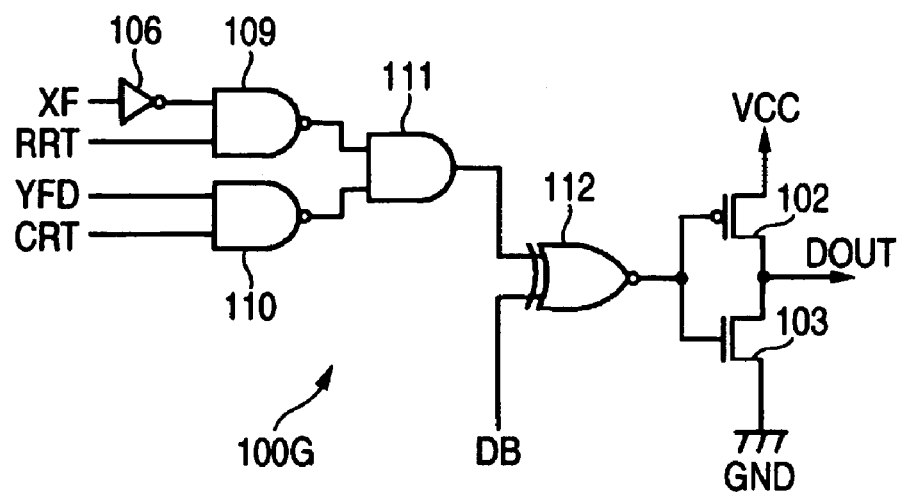
FIG. 4 is a circuit diagram of an output buffer illustrating a fourth embodiment of the invention.

FIG. 4 is a circuit diagram of an output buffer illustrating a fourth embodiment of the invention. This output buffer 100G is disposed instead of the output buffer 100A shown in FIG. 1. The same components as those shown in FIG. 1 are designated the same numerals and signs.

The output buffer 100G has an inverter 106 to which the control signal XF is applied. The output of the inverter 106 is connected to one input of a two-input NAND 109. The test signal RRT is applied to the other input of the NAND 109. Furthermore, the test signal CRT and the control signal YFD are applied to a two-input NAND 110. The outputs of the NANDs 109 and 110 are connected to the input of a two-input AND 111. The output of the AND 111 is connected to one input of an exclusive NOR gate (hereafter, it is called 'ENOR') 112. The data signal DB is applied to the other input of the ENOR 112. The output of the ENOR 112 is connected to a CMOS inverter formed of a PMOS 102 and an NMOS 103, and the CMOS inverter outputs the output data DOUT.

In the output buffer 100G, when a high-level potential is applied to the test signal RRT to turn the control signal XF to be low level in testing the redundant memory cells, the output signal of the NAND 109 is turned to be low level and the output signal of the AND 111 is turned to be low level. Consequently, the data signal DB is inverted and outputted as the output data DOUT. Similarly, when a high-level potential is applied to the test signal CRT to turn the control signal YFD to be high level, the output signal of the NAND 110 is turned to be low level and the output signal of the AND 111 turned to be low level. Consequently, the data signal DB is inverted and outputted as the output data DOUT.

On the other hand, when the redundant memory cells are not tested and both the test signals RRT and CRT are at low level, the output signals of the NANDs 109 and 110 are turned to be high level. Consequently, the output signal of the AND 111 is turned to be high level, and the data signal DB is outputted as the output data DOUT, not inverted.

As described above, the output buffer 100G of the fourth embodiment is configured in which the data signal DB is inverted to output the output data DOUT in testing the redundant memory cells. Accordingly, the fourth embodiment has the advantage that can test the redundant memory cells as similar to regular memory cells and can check whether to correctly set the test conditions inside the device from the test result.

Fifth Embodiment

Figure 5:
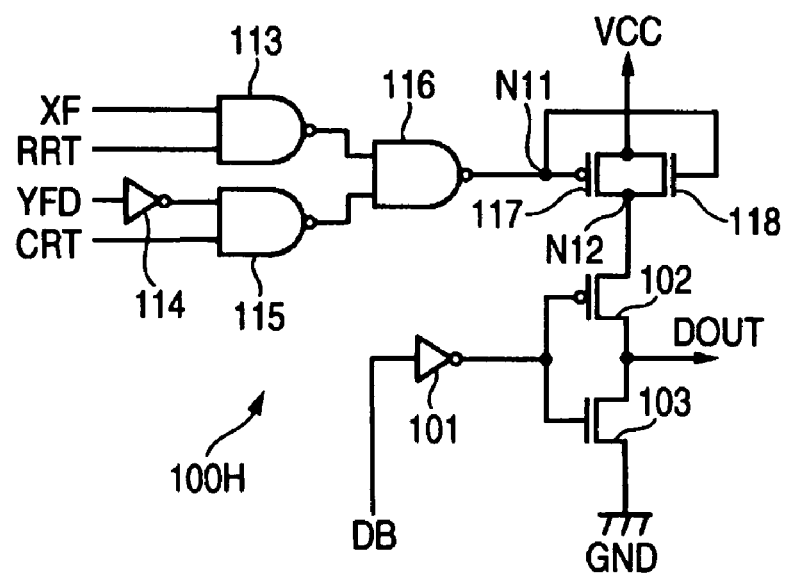
FIG. 5 is a circuit diagram of an output buffer illustrating a fifth embodiment of the invention.

FIG. 5 is a circuit diagram of an output buffer illustrating a fifth embodiment of the invention. The same components as those shown in FIG. 1 are designated the same numerals and signs. This output buffer 100H has a two-input NAND 113 to which the test signal RRT and the control signal XF are applied, and a two-input NAND 115 to which the test signal CRT and the control signal YFD inverted by an inverter 114 are applied. The outputs of the NANDs 113 and 115 are connected to the inputs of a two-input NAND 116, and the output of the NAND 116 is connected to a node N11.

Furthermore, the output buffer 100H has a PMOS 117 and an NMOS 118 connected in parallel with each other between the power supply voltage VCC and a node N12. The gate of the PMOS 117 and the NMOS 118 is connected to a node N11. Moreover, a CMOS inverter formed of a PMOS 102 and an NMOS 103 is connected between the node N12 and the ground voltage GND. The data signal DB is applied to the input of the CMOS inverter through an inverter 101, and the output data DOUT is outputted from the output thereof.

In the output buffer 100H, only when the control signals XF and YFD are not turned to be correct level in testing the redundant memory cells, that is, only when the test signal RRT is at high level and the control signal XF is at high level, or the test signal CRT is at high level and the control signal YFD is at low level, the output signal of the NAND 116 (that is, the node N11) is turned to be high level. Consequently, the PMOS 117 is in the off state, the NMOS 118 is in the on state and the potential of the node N12 is VCC−Vt (where Vt is the threshold voltage of the NMOS 118). Therefore, the potential of the output data DOUT at high level is not increased to the power supply voltage VCC, which is turned to be VCC−Vt.

On the other hand, when the test configurations for the redundant memory cells are set correctly, or in case of normal memory access, the node N11 is turned to be low level. Consequently, the PMOS 117 is in the on state, the NMOS 118 is in the off state, and the node N12 is the power supply voltage VCC. The potential of the output data DOUT at high level is increased to the power supply voltage VCC.

As described above, the output buffer 100H of the fifth embodiment is configured in which the power supply voltage of the output CMOS inverter circuit is decreased when the internal control signals are not set correctly in testing the redundant memory cells. Accordingly, the fifth embodiment has the advantage that the potential of the output data DOUT at high level is checked to allow checking whether to correctly set the test conditions inside the device.

Sixth Embodiment

Figure 6:
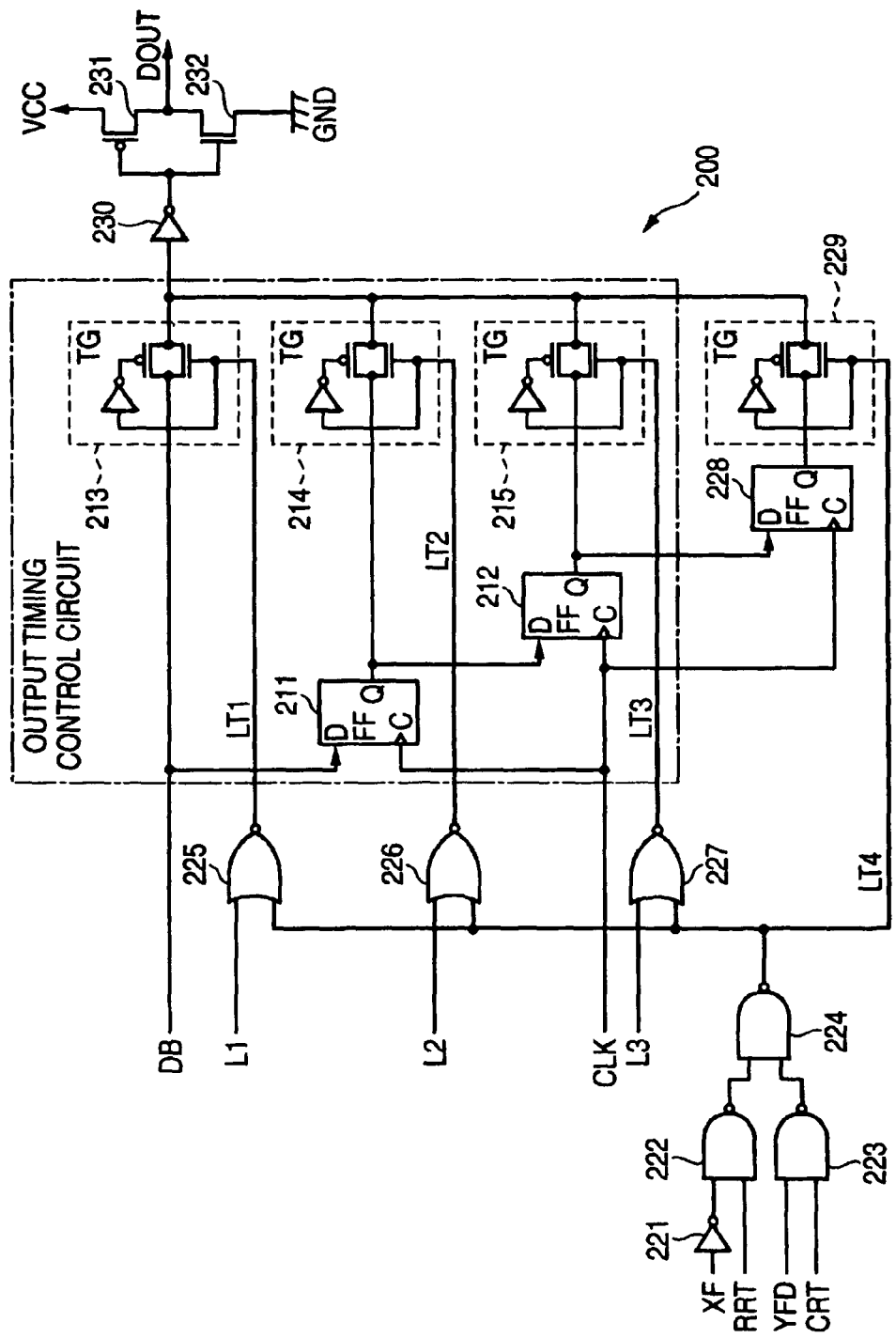
FIG. 6 is a circuit diagram of an output buffer illustrating a sixth embodiment of the invention.

FIG. 6 is a circuit diagram of an output buffer illustrating a sixth embodiment of the invention. This output buffer 200 is adapted to an output buffer for a traditional synchronous DRAM (hereafter, it is called SDRAM). The portion surrounded by an alternate long and short dash line is a traditional output timing control circuit 210.

The output timing control circuit 210 is configured of flip flops (hereafter, it is called 'FF') 211 and 212 for sequentially delaying the data signal DB in synchronization with clock signal CLK, and TGs 213, 214 and 215 for selecting and outputting the data signal DB or delayed data signals.

In the output timing control circuit 210, in the case of latency 1, control signal LT1 is turned to be high level and the TG 213 is in the on state for output in the same clock cycle as the clock signal CLK. In addition, in the case of latencies 2 and 3, control signals LT2 and LT3 are turned to be high level and the TGs 214 and 215 are in the on state for output as delayed by one to two clock cycles from the clock signal CLK.

In the output buffer 200 of the sixth embodiment, in addition to the test signals RRT and CRT and the logics of the control signals XF and YFD, a circuit is added for outputting the output data DOUT at the timing corresponding to latency 4 when the test conditions are correctly set for the inside of the redundant memory cells.

More specifically, the output buffer 200 has a two-input NAND 222 to which the test signal RRT and the control signal XF inverted by an inverter 221 are applied, and a two-input NAND 223 to which the test signal CRT and the control signal YFD are applied. The outputs of the NANDs 222 and 223 are connected to a two-input NAND 224, and control signal LT4 outputted from the NAND 224 is applied to one inputs of NORs 225 to 227. Control signals L1 to L3 are applied to the other inputs of the NORs 225 to 227, and the control signals LT1 to LT3 are applied to the output timing control circuit 210 from the NORs 225 to 227.

Furthermore, the output buffer 200 has an FF 228 for delaying further the output signal of the FF 212 by one clock cycle, and a TG 229 controlled by the control signal LT4 is connected to the output of the FF 228. The outputs of the TGs 213 to 215 and 229 are connected to a CMOS inverter formed of a PMOS 231 and an NMOS 232 through an inverter 230, and the CMOS inverter outputs the output data DOUT.

In the output buffer 200, when the internal conditions are set correctly in testing the redundant memory cells, the control signal LT4 outputted from the NAND 224 is turned to be high level, and the TG 229 is in the on state to output the output data DOUT at the timing of latency 4.

As described above, the output buffer 200 of the sixth embodiment is configured to output the output data DOUT at the timing of latency 4 when the internal control signals are set correctly in testing the redundant memory cells. Accordingly, the sixth embodiment has the advantage that the timing to output the output data DOUT is checked to allow checking whether to correctly set the test conditions inside the device.

Moreover, the invention is not limited to the embodiments, which can be modified variously. As the modified examples, for instance, the following are named.

The configuration of the row-replacement circuit 30 shown in FIG. 1 is not limited to that shown in the drawing. It is acceptable to use a row switching circuit similar to the column switching circuit 70. In addition, it is fine to use a column-replacement circuit similar to the row-replacement circuit 30 instead of the column switching circuit 70 shown in FIG. 1.

The configuration of the logic gate in the output buffer 100A is not limited to that shown in the drawing. It is acceptable that the logic gate is configured of any combinations when the same conditions can be set.

The examples adapted to DRAMs have been described, but the invention can be similarly adapted to the semiconductor memory devices of other systems such as SRAMs (Static Random Access Memory).

The DRAM with a set of the redundant memory cells in both the column direction and the row direction has been exemplified. However, for example, the invention can be similarly adapted to semiconductor memory devices with redundant memory cells only in the column direction. Furthermore, the invention can be similarly adapted to semiconductor memory devices with a plurality of redundant memory cells in the same direction As described above in detail, the second invention has the output circuit for outputting data read out of the redundant memory cells at a level different from the normal level when the test conditions for the redundant memory cells are correctly set. Accordingly, the second invention can check whether to correctly set the test conditions inside the device.

What is claimed is:

1. A semiconductor memory device comprising:
 a redundant memory cell for use instead of a memory cell when the memory cell has a defect;
 an electrode applied with a test signal for setting a test condition from outside in testing the redundant memory cell; and
 an output circuit for outputting data read out of the memory cell and the redundant memory cell,
 wherein when the test signal is applied to the electrode to set the test condition for the redundant memory cell, the output circuit is configured to output data read out of the redundant memory cell at a level different from a signal level of data read out of the memory cell for output.

2. The semiconductor memory device according to claim 1, wherein when the test condition for the redundant memory cell is set, the output circuit outputs the data read out of the redundant memory cell of high-level potential at a lower potential than a predetermined voltage.

3. The semiconductor memory device according to claim 1, wherein when the test condition for the redundant memory cell is set, the output circuit inverts and outputs data read out of the redundant memory cell.

4. The semiconductor memory device according to claim 1, wherein the output circuit comprises:
 a first logic gate for determining that both the test signal and an internal control signal created based on the test signal have normal logical values; and
 a second logic gate for inverting and outputting the data read out of the redundant memory cell based on an output signal of the first logic gate.

5. The semiconductor memory device according to claim 1, wherein the output circuit includes:
 a first gate circuit having an input terminal for receiving the test signal and an output terminal for outputting an internal control signal;
 a second gate circuit having a first input terminal for receiving the internal control signal and a second input terminal for receiving the data read out of the memory cell and the redundant memory cell and an output terminal; and an inverter having an input terminal connected to the output terminal of the second gate circuit and an output terminal.

6. The semiconductor memory device according to claim 5, wherein the first gate circuit is an AND circuit.

7. The semiconductor memory device according to claim 5, wherein the second gate circuit is an exclusive NOR circuit.

8. The semiconductor memory device according to claim 1, wherein the output circuit includes:
an inverter having a first power terminal connected to receive a first power potential, a second power terminal connected to receive a second power potential, an input terminal for receiving the data read out of the memory cell and the redundant memory cell and an output terminal;
a gate circuit having an input terminal for receiving the test signal and an output terminal for outputting an internal control signal; and
a control circuit connected to the first power terminal of the inverter, the control circuit reducing a voltage of the first power potential in accordance with the internal control signal.

9. The semiconductor memory device according to claim 8, where in the gate circuit is a NAND circuit.

10. The semiconductor memory device according to claim 8, wherein the control circuit has a PMOS transistor connected between the first power terminal of the inverter and the first power potential, and wherein the control PMOS transistor has a gate connected to the output terminal of the gate circuit.

11. A semiconductor memory device comprising:
first and second redundant memory cells for use instead of a memory cell when the memory cell has a defect;
first and second electrodes applied with a test signal for setting a test condition from outside in testing the first and second redundant memory cells; and
an output circuit for outputting data read out of the memory cell and the first and second redundant memory cells,
wherein when the test signal is applied to both the first and second electrodes to set the test condition for the first and second redundant memory cells, the output circuit is configured to output a signal at a fixed level.

12. The semiconductor memory device according to claim 11, wherein when the test condition for the first and second redundant memory cells is set, the output circuit outputs a signal at high level or low level.

13. The semiconductor memory device according to claim 11, wherein the output circuit comprises:

a first logic gate for determining that the test signal for the first and second redundant memory cells and an internal control signal created based on the test signal have all normal logical values; and
a second logic gate for fixing an output signal at high level or low level by an output signal of the first logic gate when a normal test condition is set.

14. The semiconductor memory device according to claim 11, wherein the output circuit includes:
a first gate circuit having an input terminal for receiving the test signal and an output terminal for outputting an internal control signal;
a second gate circuit having a first input terminal for receiving the internal control signal and a second input terminal for receiving the data read out of the memory cell and the redundant memory cell and an output terminal; and
an inverter having an input terminal connected to the output terminal of the second gate circuit and an output terminal.

15. The semiconductor memory device according to claim 14, wherein the first gate circuit is a NAND circuit.

16. The semiconductor memory device according to claim 14, wherein the first gate circuit is an AND circuit.

17. The semiconductor memory device according to claim 14, wherein the second gate circuit is a NAND circuit.

18. The semiconductor memory device according to claim 14, wherein the second gate circuit is a NOR circuit.

19. A semiconductor memory device comprising:
a redundant memory cell for use instead of a memory cell when the memory cell has a defect;
an electrode applied with a test signal for setting a test condition from outside in testing the redundant memory cell; and
an output circuit for outputting data read out of the memory cell and the redundant memory cell,
wherein when the test signal is applied to the electrode to set the test condition for the redundant memory cell, the output circuit is configured to output data read out of the redundant memory cell at timing different from timing to output data read out of the memory cell.

20. The semiconductor memory device according to claim 19, wherein the output circuit includes an output timing control circuit for controlling a timing for outputting the data read out of the redundant memory cell.

* * * * *